(12) United States Patent
Manning

(10) Patent No.: US 6,519,675 B1
(45) Date of Patent: *Feb. 11, 2003

(54) TWO STEP MEMORY DEVICE COMMAND BUFFER APPARATUS AND METHOD AND MEMORY DEVICES AND COMPUTER SYSTEMS USING SAME

(75) Inventor: Troy A. Manning, Meridian, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

This patent is subject to a terminal disclaimer.

(21) Appl. No.: 09/444,109

(22) Filed: Nov. 22, 1999

Related U.S. Application Data

(63) Continuation of application No. 08/874,690, filed on Jun. 13, 1997, now Pat. No. 5,996,043.

(51) Int. Cl.[7] ............................................. G06F 12/00
(52) U.S. Cl. ...................................... 711/105; 711/167
(58) Field of Search .............................. 711/105, 109, 711/157, 167, 219; 365/78, 80, 189.05, 189.12, 230.08, 290; 710/53, 5, 20; 370/60, 352–356, 394

(56) References Cited

U.S. PATENT DOCUMENTS

| 4,312,068 A | 1/1982 | Goss et al. ..................... 371/37 |
| 4,365,295 A | 12/1982 | Katzman et al. ............. 364/200 |
| 4,630,230 A | 12/1986 | Sundet ........................ 364/900 |
| 4,695,952 A | 9/1987 | Howland ..................... 364/200 |
| 4,768,190 A | 8/1988 | Giancarlo ..................... 370/86 |
| 4,845,664 A | 7/1989 | Aichelmann, Jr. et al. .. 364/900 |
| 4,849,702 A | 7/1989 | West et al. .................... 328/63 |
| 4,943,946 A | 7/1990 | Brent ..................... 365/189.12 |
| 4,949,301 A | 8/1990 | Joshi et al. .................. 364/900 |
| 5,099,481 A | 3/1992 | Miller ....................... 371/22.1 |

(List continued on next page.)

FOREIGN PATENT DOCUMENTS

| DE | 197 34 719 A1 | 5/1998 |
| EP | 0 468 480 A2 | 5/1992 |
| EP | 0 605 887 A2 | 7/1995 |
| GB | 2 128 383 A | 4/1984 |
| JP | 59116829 | 7/1984 |
| WO | WO 96/24935 | 8/1996 |

OTHER PUBLICATIONS

Prince, Betty, "High Performance Memories," John Wiley & Sons Ltd., West Sussex, England, 1996, pp. 143–146.

(List continued on next page.)

*Primary Examiner*—Matthew Kim
*Assistant Examiner*—Denise Tran
(74) *Attorney, Agent, or Firm*—Dorsey & Whitney LLP

(57) ABSTRACT

A command buffer for use in packetized DRAM includes a two stage shift register for shifting for sequentially storing two of four 10-bit command words in each packet. After the first two words of each packet have been stored, they are transferred to a first storage register and output from the first storage register. After the final two words of each packet have been shifted into the shift register, they are transferred to a second storage register and output from the second storage register. The first two command words are output from the first storage register before the last two command words are applied to the command buffer. As a result, the DRAM can start processing the first two command words of the command packet before the entire command packet has been received.

16 Claims, 11 Drawing Sheets

U.S. PATENT DOCUMENTS

| | | | |
|---|---|---|---|
| 5,175,732 A | 12/1992 | Hendel et al | 370/94.1 |
| 5,235,595 A | 8/1993 | O'Dowd | 370/94.1 |
| 5,297,029 A | 3/1994 | Nakai et al. | 365/238.5 |
| 5,309,432 A * | 5/1994 | Kanakia | 370/60 |
| 5,321,700 A | 6/1994 | Brown et al. | 371/27 |
| 5,325,493 A | 6/1994 | Herrell et al. | 395/375 |
| 5,337,410 A | 8/1994 | Appel | 395/162 |
| 5,341,483 A | 8/1994 | Frank et al. | 395/400 |
| 5,355,345 A | 10/1994 | Dickinson et al. | 365/230.01 |
| 5,367,643 A | 11/1994 | Chang et al. | 395/325 |
| 5,381,536 A | 1/1995 | Phelps et al. | 711/168 |
| 5,390,224 A | 2/1995 | Komatsuda | 377/56 |
| 5,402,390 A | 3/1995 | Ho et al. | 365/225.7 |
| 5,454,093 A | 9/1995 | Abdulhafiz et al. | 395/460 |
| 5,471,430 A | 11/1995 | Sawada et al. | 365/222 |
| 5,553,010 A | 9/1996 | Tanihira et al. | 364/715.08 |
| 5,557,763 A | 9/1996 | Senter et al. | 712/23 |
| 5,566,325 A | 10/1996 | Bruce, II et al. | 395/494 |
| 5,581,512 A | 12/1996 | Kitamura | 365/233 |
| 5,600,605 A | 2/1997 | Schaefer | 365/233 |
| 5,615,355 A | 3/1997 | Wagner | 395/494 |
| 5,636,174 A | 6/1997 | Rao | 365/230.03 |
| 5,640,354 A | 6/1997 | Jang et al. | 365/201 |
| 5,652,733 A | 7/1997 | Chen et al. | 365/233 |
| 5,701,434 A | 12/1997 | Nakagawa | 395/484 |
| 5,713,005 A | 1/1998 | Proebsting | 395/496 |
| 5,732,041 A | 3/1998 | Joffe | 365/230.05 |
| 5,737,563 A | 4/1998 | Shigeeda | 395/405 |
| 5,742,760 A | 4/1998 | Picazo, Jr. et al. | 395/200.02 |
| 5,764,584 A | 6/1998 | Fukiage et al. | 365/230.03 |
| 5,778,419 A | 7/1998 | Hansen et al. | 711/112 |
| 5,793,688 A | 8/1998 | McLaury | 365/203 |
| 5,793,996 A | 8/1998 | Childers et al. | 710/129 |
| 5,812,074 A | 9/1998 | Chung | 341/67 |
| 5,813,023 A | 9/1998 | McLaury | 711/105 |
| 5,825,711 A | 10/1998 | Manning | 365/230.03 |
| 5,831,929 A | 11/1998 | Manning | 365/233 |
| 5,835,925 A | 11/1998 | Kessler et al. | 711/2 |
| 5,838,990 A | 11/1998 | Park et al. | 395/834 |
| 5,848,431 A | 12/1998 | Pawlowski | 711/5 |
| 5,860,080 A | 1/1999 | James et al. | 711/4 |
| 5,887,146 A | 3/1999 | Baxter | 395/284 |
| 5,907,860 A | 5/1999 | Garibay, Jr. et al. | 711/17 |
| 5,907,864 A | 5/1999 | Potts et al. | 711/169 |
| 5,920,710 A | 7/1999 | Tan et al. | 395/392 |
| 5,954,804 A | 9/1999 | Farmwald et al. | 710/36 |
| 5,996,043 A | 11/1999 | Manning | 711/105 |
| 6,032,232 A | 2/2000 | Lindeborg et al. | 711/149 |
| 6,035,369 A | 3/2000 | Ware et al. | 711/105 |
| 6,055,615 A | 4/2000 | Okajima | 711/169 |
| 6,175,894 B1 * | 1/2001 | Manning | 711/109 |
| 6,175,905 B1 | 1/2001 | Manning | 711/169 |
| 6,178,488 B1 | 1/2001 | Manning | 711/169 |
| 6,212,601 B1 | 4/2001 | Shiell | 711/118 |
| 6,223,265 B1 | 4/2001 | Kawasaki et al. | 711/167 |

OTHER PUBLICATIONS

Descriptive literature entitled, "400 MHz SLDRAM, 4M × 16 SLDRAM Piplined, Eight Bank, 2.5 V Operation," SLDRAM Consortium Advance Sheet, published throughout the United States, pp. 1–22.

"Draft Standard for a High–Speed Memory Interface (SyncLink)," Microprocessor and Microcomptuer Standards Subcommittee of the IEEE Computer Society, Copyright 1996 by the Institute of Electrical and Electronics Engineers, Inc., New York, NY, pp. 1–56.

"Increasing Data Read Rate From Memories," IBM Technical Disclosure Bulletin, vol. 30, No. 12, May 1988, pp. 339–341.

* cited by examiner

| CA9 | CA8 | CA7 | CA6 | CA5 | CA4 | CA3 | CA2 | CA1 | CA0 |
|---|---|---|---|---|---|---|---|---|---|
| ID6 | ID5 | ID4 | ID3 | ID2 | ID1 | ID0 | CMD5 | CMD4 | CMD3 |
| CMD2 | CMD1 | CMD0 | BNK2 | BNK1 | BNK0 | ROW9 | ROW8 | ROW7 | ROW6 |
| ROW5 | ROW4 | ROW3 | ROW2 | ROW1 | ROW0 | 0 | 0 | 0 | 0 |
| 0 | 0 | 0 | COL6 | COL5 | COL4 | COL3 | COL2 | COL1 | COL0 |

ID6–ID0 = DEVICE ID VALUE
CMD5–CMD0 = COMMAND CODE
BNK2–BNK0 = BANK ADDRESS
ROW9–ROW0 = ROW ADDRESS
COL6–COL0 = COLUMN ADDRESS
0 = UNUSED

*Fig. 2*
*(Prior Art)*

TWO STEP MEMORY DEVICE COMMAND BUFFER APPARATUS AND METHOD AND MEMORY DEVICES AND COMPUTER SYSTEMS USING SAME

CROSS-REFERENCE TO RELATED APPLICATION

This application is a continuation of U.S. patent application Ser. No. 08/874,690, filed Jun. 13, 1997 now U.S. Pat. No. 5,996,043.

TECHNICAL FIELD

This invention relates to memory devices used in computer systems, and, more particularly, to an input buffer used to rapidly process commands in memory devices.

BACKGROUND OF THE INVENTION

Conventional computer systems include a processor (not shown) coupled to a variety of memory devices, including read-only memories ("ROMs") which traditionally store instructions for the processor, and a system memory to which the processor may write data and from which the processor may read data. The processor may also communicate with an external cache memory, which is generally a static random access memory ("SRAM"). The processor 12 also communicates with input devices, output devices, and data storage devices.

Processors generally operate at a relatively high speed. Processors such as the Pentium® and Pentium Pro® microprocessors are currently available that operate at clock speeds of at least 200 MHz. However, the remaining components of existing computer systems, with the exception of SRAM cache, are not capable of operating at the speed of the processor. For this reason, the system memory devices, as well as the input devices, output devices, and data storage devices, are not coupled directly to the processor bus. Instead, the system memory devices are generally coupled to the processor bus through a memory controller, bus bridge or similar device, and the input devices, output devices, and data storage devices are coupled to the processor bus through a bus bridge. The memory controller allows the system memory devices to operate at a lower clock frequency that is substantially lower than the clock frequency of the processor. Similarly, the bus bridge allows the input devices, output devices, and data storage devices to operate at a substantially lower frequency. Currently, for example, a processor having a 200 MHz clock frequency may be mounted on a mother board having a 66 MHz clock frequency for controlling the system memory devices and other components.

Access to system memory is a frequent operation for the processor. The time required for the processor, operating, for example, at 200 MHz, to read data from or write data to a system memory device operating at, for example, 66 MHz, greatly slows the rate at which the processor is able to accomplish its operations. Thus, much effort has been devoted to increasing the operating speed of system memory devices.

System memory devices are generally dynamic random access memories ("DRAMs"). Initially, DRAMs were asynchronous and thus did not operate at even the clock speed of the motherboard. In fact, access to asynchronous DRAMs often required that wait states be generated to halt the processor until the DRAM had completed a memory transfer. However, the operating speed of asynchronous DRAMs was successfully increased through such innovations as burst and page mode DRAMs which did not require that an address be provided to the DRAM for each memory access. More recently, synchronous dynamic random access memories ("SDRAMs") have been developed to allow the pipelined transfer of data at the clock speed of the motherboard. However, even SDRAMs are incapable of operating at the clock speed of currently available processors. Thus, SDRAMs cannot be connected directly to the processor bus, but instead must interface with the processor bus through a memory controller, bus bridge, or similar device. The disparity between the operating speed of the processor and the operating speed of SDRAMs continues to limit the speed at which processors may complete operations requiring access to system memory.

A solution to this operating speed disparity has been proposed in the form of a computer architecture known as "SyncLink." In the SyncLink architecture, the system memory is coupled to the processor directly through the processor bus. Rather than requiring that separate address and control signals be provided to the system memory, SyncLink memory devices receive command packets that include both control and address information. The SyncLink memory device then outputs or receives data on a data bus that is coupled directly to the data bus portion of the processor bus.

An example of a computer system 10 using a SyncLink packetized DRAM architecture is shown in FIG. 1. The computer system 10 includes a processor 12 having a processor bus 14 coupled to three packetized dynamic random access memory or SyncLink DRAMs ("SLDRAM") devices 16a–c. The computer system 10 also includes one or more input devices 20, such as a keypad or a mouse, coupled to the processor 12 through a bus bridge 22 and an expansion bus 24, such as an industry standard architecture ("ISA") bus or a Peripheral component interconnect ("PCI") bus. The input devices 20 allow an operator or an electronic device to input data to the computer system 10. One or more output devices 30 are coupled to the processor 12 to display or otherwise output data generated by the processor 12. The output devices 30 are coupled to the processor 12 through the expansion bus 24, bus bridge 22 and processor bus 14. Examples of output devices 24 include printers and a video display units. One or more data storage devices 38 are coupled to the processor 12 through the processor bus 14, bus bridge 22, and expansion bus 24 to store data in or retrieve data from storage media (not shown). Examples of storage devices 38 and storage media include fixed disk drives floppy disk drives, tape cassettes and compact-disk read-only memory drives.

In operation, the processor 12 communicates with the memory devices 16a–c via the processor bus 14 by sending the memory devices 16a–c command packets that contain both control and address information. Data is coupled between the processor 12 and the memory devices 16a–c, through a data bus portion of the processor bus 14. Although all the memory devices 16a–c are coupled to the same conductors of the processor bus 14, only one memory device 16a–c at a time reads or writes data, thus avoiding bus contention on the processor bus 14. Bus contention is avoided by each of the memory devices 16a–c and the bus bridge 22 having a unique identifier, and the command packet contains an identifying code that selects only one of these components.

A typical command packet for a SyncLink packetized DRAM is shown in FIG. 2. The command packet is formed by 4 command words each of which contains 10 bits of data.

The first command word $W_1$ contains 7 bits of data identifying the packetized DRAM 16a–c that is the intended recipient of the command packet. As explained below, each of the packetized DRAMs is provided with a unique ID code that is compared to the 7 ID bits in the first command word $W_1$. Thus, although all of the packetized DRAMs 16a–c will receive the command packet, only the packetized DRAM 16a–c having an ID code that matches the 7 ID bits of the first command word $W_1$ will respond to the command packet.

The remaining 3 bits of the first command word $W_1$ as well as 3 bits of the second command word $W_2$ comprise a 6 bit command. Typical commands are read and write in a variety of modes, such as accesses to pages or banks of memory cells. The remaining 7 bits of the second command word $W_2$ and portions of the third and fourth words $W_3$ and $W_4$ comprise a 20 bit address specifying a bank, row and column address for a memory transfer or the start of a multiple bit memory transfer. In one embodiment, the 20-bit address is divided into 3 bits of bank address, 10 bits of row address, and 7 bits of column address.

Although the command packet shown in FIG. 2 is composed of 4 command words each containing up to 10 bits, it will be understood that a command packet may contain a lesser or greater number of command words, and each command word may contain a lesser or greater number of bits.

The computer system 10 also includes a number of other components and signal lines that have been omitted from FIG. 1 in the interests of brevity. For example, as explained below, the memory devices 16a–c also receive a master clock signal to provide internal timing signals, a data clock signal clocking data into and out of the memory device 16, and a FLAG signal signifying the start of a command packet.

The memory devices 16 are shown in block diagram form in FIG. 3. Each of the memory devices 16 includes a clock divider and delay circuit 40 that receives a master clock signal 42 and generates a large number of other clock and timing signals to control the timing of various operations in the memory device 16. The memory device 16 also includes a command buffer 46 and an address capture circuit 48 which receive an internal clock CLK signal, a command packet CA0–CA9 on a command bus 50, and a FLAG signal on line 52. As explained above, the command packet contains control and address information for each memory transfer, and the FLAG signal identifies the start of a command packet. The command buffer 46 receives the command packet from the bus 50, and compares at least a portion of the command packet to identifying data from an ID register 56 to determine if the command packet is directed to the memory device 16 a or some other memory device 16b, c. If the command buffer 46 determines that the command is directed to the memory device 16 a, it then provides the command to a command decoder and sequencer 60. The command decoder and sequencer 60 generates a large number of internal control signals to control the operation of the memory device 16 a during a memory transfer corresponding to the command.

The address capture circuit 48 also receives the command packet from the command bus 50 and outputs a 20-bit address corresponding to the address information in the command. The address is provided to an address sequencer 64 which generates a corresponding 3-bit bank address on bus 66, an 11-bit row address on bus 68, and a 6-bit column address on bus 70.

One of the problems of conventional DRAMs is their relatively low speed resulting from the time required to precharge and equilibrate circuitry in the DRAM array. The packetized DRAM 16a shown in FIG. 3 largely avoids this problem by using a plurality of memory banks 80, in this case eight memory banks 80a–h. After a memory read from one bank 80a, the bank 80a can be precharged while the remaining banks 80b–h are being accessed. Each of the memory banks 80a–h receives a row address from a respective row latch/decoder/driver 82a–h. All of the row latch/decoder/drivers 82a–h receive the same row address from a predecoder 84 which, in turn, receives a row is address from either a row address register 86 or a refresh counter 88 as determined by a multiplexer 90. However, only one of the row latch/decoder/drivers 82a–h is active at any one time as determined by bank control logic 94 as a function of bank data from a bank address register 96.

The column address on bus 70 is applied to a column latch/decoder 100 which, in turn, supplies I/O gating signals to an I/O gating circuit 102. The I/O gating circuit 102 interfaces with columns of the memory banks 80a–h through sense amplifiers 104. Data is coupled to or from the memory banks 80a–h through the sense amps 104 and I/O gating circuit 102 to a data path subsystem 108 which includes a read data path 110 and a write data path 112. The read data path 110 includes a read latch 120 receiving and storing data from the I/O gating circuit 102. In the memory device 16a shown in FIG. 2, 64 bits of data are applied to and stored in the read latch 120. The read latch then provides four 16-bit data words to a multiplexer 122. The multiplexer 122 sequentially applies each of the 16-bit data words to a read FIFO buffer 124. Successive 16-bit data words are clocked through the FIFO buffer 124 by a clock signal generated from an internal clock by a programmable delay circuit 126. The FIFO buffer 124 sequentially applies the 16-bit words and two clock signals (a clock signal and a quadrature clock signal) to a driver circuit 128 which, in turn, applies the 16-bit data words to a data bus 130 forming part of the processor bus 14. The driver circuit 128 also applies the clock signals to a clock bus 132 so that a device such as the processor 12 reading the data on the data bus 130 can be synchronized with the data.

The write data path 112 includes a receiver buffer 140 coupled to the data bus 130. The receiver buffer 140 sequentially applies 16-bit words from the data bus 130 to four input registers 142, each of which is selectively enabled by a signal from a clock generator circuit 144. Thus, the input registers 142 sequentially store four 16-bit data words and combine them into one 64-bit data word applied to a write FIFO buffer 148. The write FIFO buffer 148 is clocked by a signal from the clock generator 144 and an internal write clock WCLK to sequentially apply 64-bit write data to a write latch and driver 150. The write latch and driver 150 applies the 64-bit write data to one of the memory banks 80a–h through the I/O gating circuit 102 and the sense amplifier 104.

As mentioned above, an important goal of the SyncLink architecture is to allow data transfer between a processor and a memory device to occur at a significantly faster rate. However, the operating rate of a packetized DRAM, including the packetized DRAM shown in FIG. 3, is limited by the time required to receive and process command packets applied to the memory device 16a. More specifically, not only must the command packets be received and stored, but they must also be decoded and used to generate a wide variety of signals. However, in order for the memory device 16a to operate at a very high speed, the command packets must be applied to the memory device 16a at a correspondingly high speed. As the operating speed of the memory device 16a increases, the command packets are provided to the memory device 16a at a rate that can exceed the rate at which the command buffer 46 can process the command packets.

One approach to increasing the operating speed of a packetized DRAM is described in U.S. patent application Ser. No. 08/813,041 filed Mar. 5, 1997, now U.S. Pat. No. 6,175,894 to Troy A. Manning. In the DRAM described in the Manning application, the four 10-bit command words in the command packet are sequentially shifted through a four stage, 10-bit shift register. After the four command words have been shifted into the shift register, they are simultaneously transferred to a storage register for processing by the command decoder and sequencer 60 and address sequencer 64. However, processing of the command words does not begin until all four of the command words in the command packet have been shifted into the shift register and transferred to the storage register. In the packetized DRAM 16a of FIG. 3, a command word is shifted into the command buffer 46 on each edge of the clock, i.e., two command words for each clock period. Thus, there is a two clock-period delay before processing of the command packet can begin. As a result, the packetized DRAM disclosed in the Manning application provides less than optimum speed.

Although the foregoing discussion is directed to the need for faster command buffers in packetized DRAMs, similar problems exist in other memory devices, such as asynchronous DRAMs and synchronous DRAMs, which must process control and other signals at a high rate of speed. Thus, for the reasons explained above, the limited operating speed of conventional command buffers threatens to severely limit the maximum operating speed of memory devices, particularly packetized DRAMs. Therefore, there is a need for a command buffer that is able to receive and process command packets and other memory control signals at a higher rate.

SUMMARY OF THE INVENTION

A command buffer for a memory device, such as a packetized DRAM, is adapted to receive a command packet of N M-bit command words on an M-bit bus. The command buffer includes M shift registers each having an output terminal, a clock terminal and an input terminal coupled to a respective bit of the M-bit bus. Each of the shift registers has N/Y stages, with a respective command word bit applied to the input terminal of each stage being shifted to an output terminal of each stage responsive to a clock signal. The command buffer also includes Y storage registers, where Y is an integer number greater than 1. Each of the storage registers has (N/Y)*M storage cells, with each storage cell having input terminal coupled to the output terminal of a respective shift register stage, and a load terminal. Each of the storage cells stores a signal at the output terminal of the respective shift register stage responsive to a load signal applied to the load terminal of the storage cell. A control circuit generates the load signals after each N/Y of the command words having been shifted into the shift registers. The load signals are sequentially applied to the load terminals of successive storage registers so that the storage registers each receive respective N/Y command words as N command words are shifted into the shift registers. In operation, a command word stored in one of the storage registers may be processed, such as by decoding it or comparing it to a comparison word, prior to shifting other command words into the shift register and storing them in another storage register.

BRIEF DESCRIPTION OF THE DRAWINGS

FIG. 2 is a diagram showing a typical command packet for a SyncLink packetized DRAM.

DETAILED DESCRIPTION OF THE INVENTION

Figure 1:
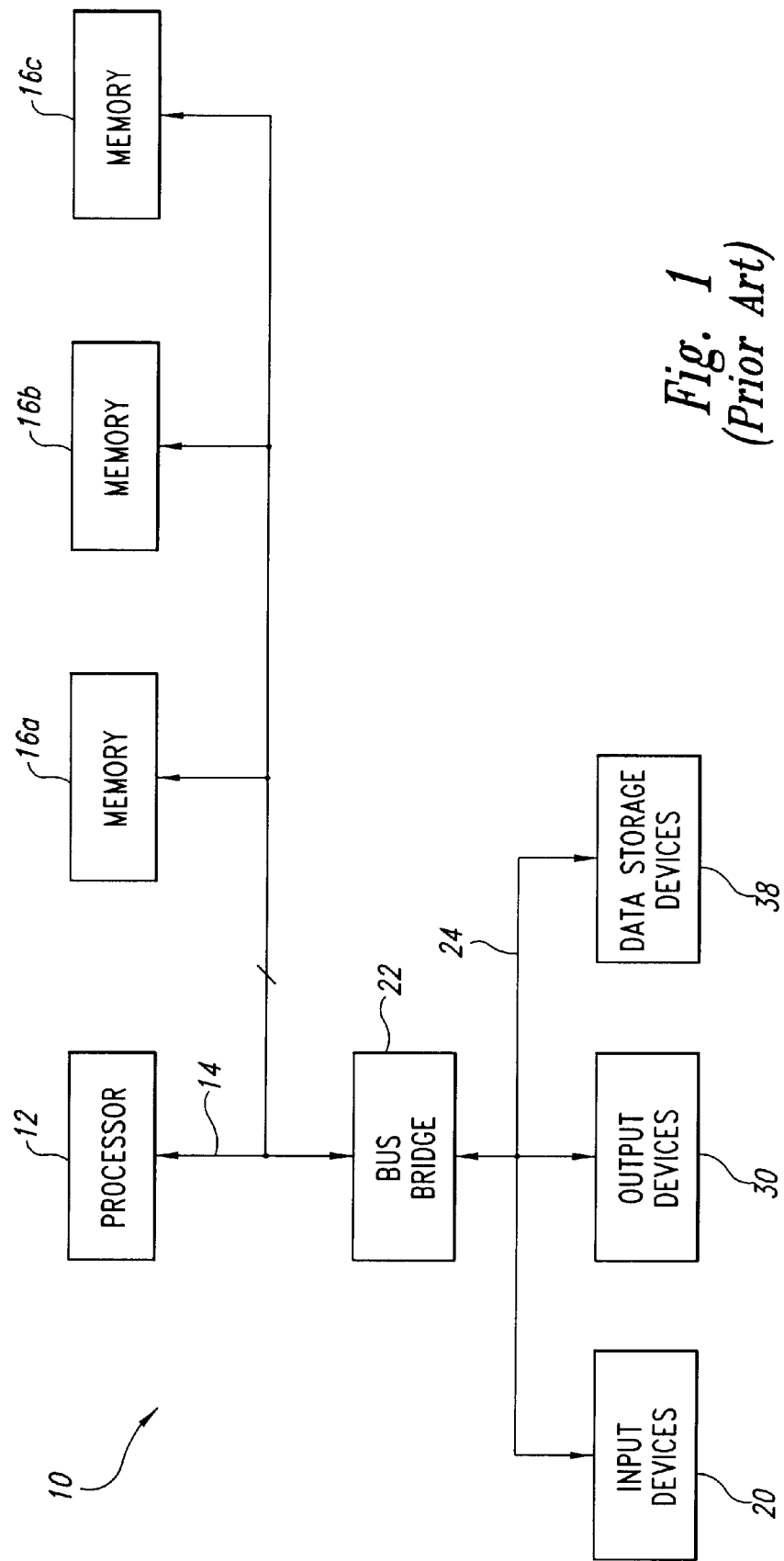
FIG. 1 is a block diagram of a computer system using SyncLink architecture.
Figure 3:
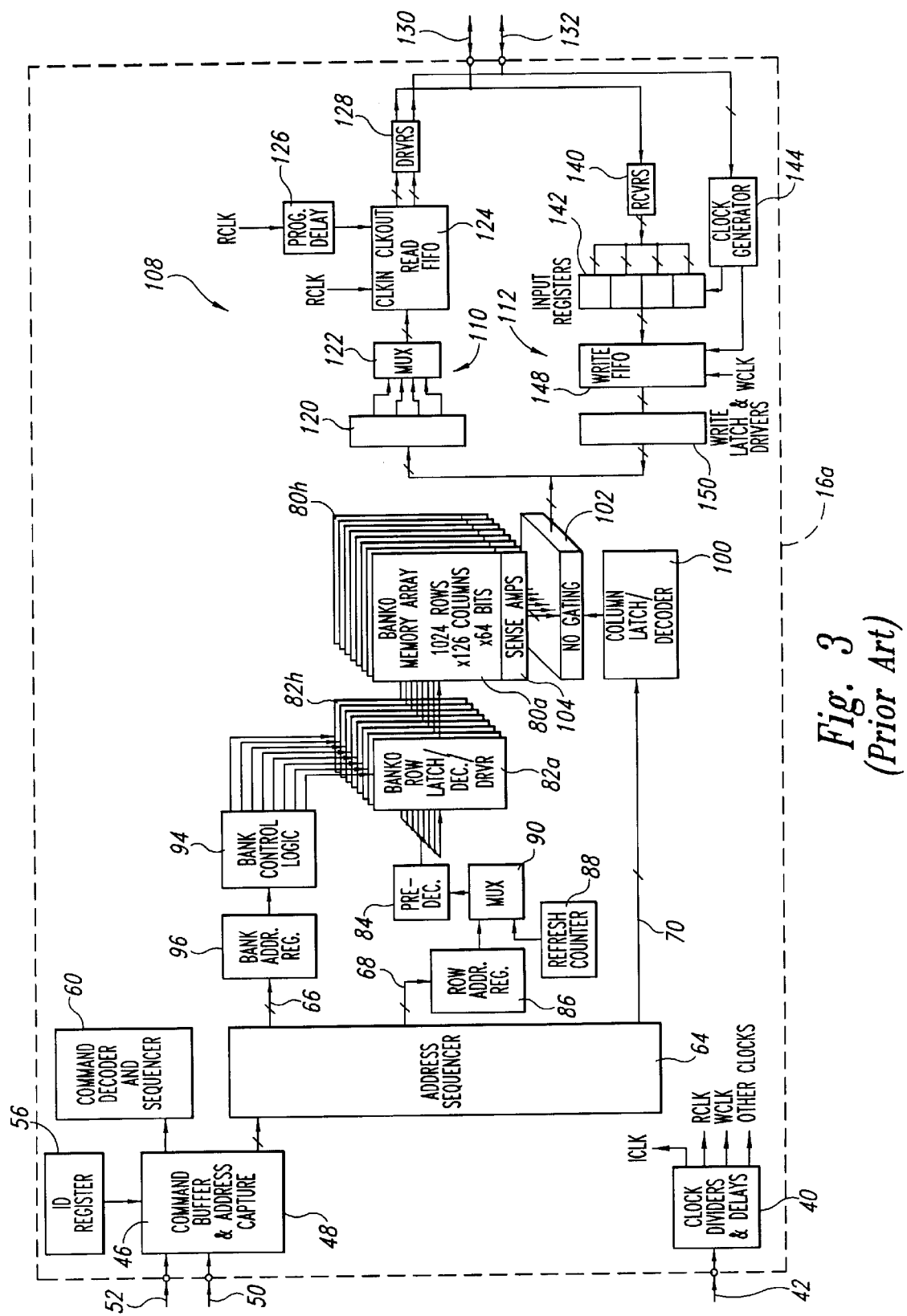
FIG. 3 is a block diagram of a packetized DRAM that may be used in the computer system of FIG. 1.
Figure 4:
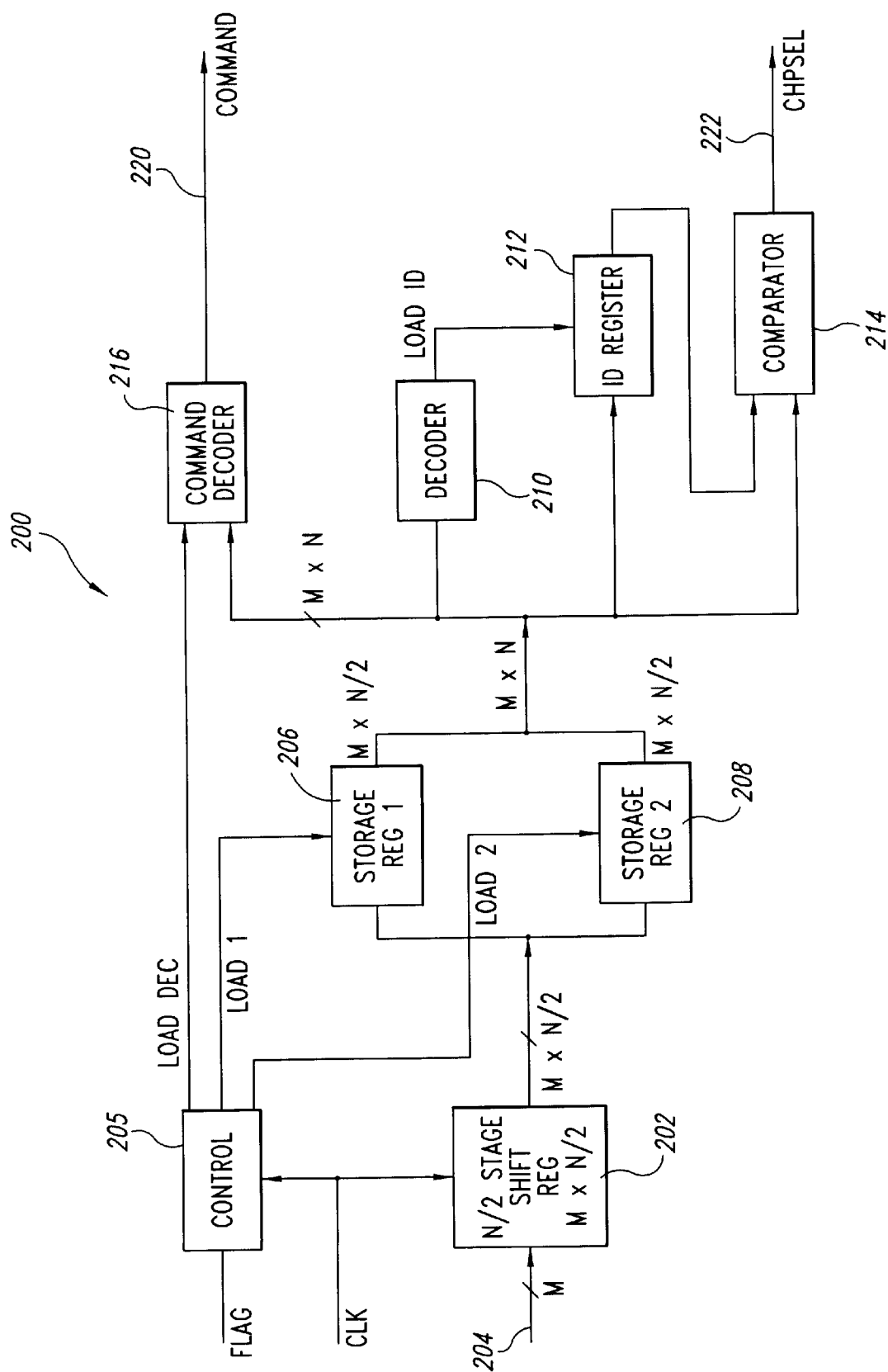
FIG. 4 is a block diagram of a command buffer that is usable in the packetized DRAM of FIG. 3.

One embodiment of a command buffer 200 in accordance with the invention is illustrated in FIG. 4. The command buffer 200 can be used in place of the command buffer 46 in FIG. 3, and the resulting memory device may be used in the computer system shown in FIG. 1. With reference to FIG. 4, a command packet consisting of a plurality of packet words are applied to a shift register 202 via a command data bus 204. The width M of the bus 204 corresponds to the size of the shift register 202, and the number N of packet words in the command packet corresponds to an integer sub-multiple of the number of stages of the shift register 202. In the embodiment shown in FIG. 4, the shift register 202 has one-half the number of stages that are in the command packet, i.e., two shift stages since there are four command words. Thus, the shift register 202 sequentially receives two groups of two 10-bit packet words responsive to a clock signal CLK. Coincident with the start of a four word command packet, a FLAG signal is applied to a control circuit 205 which is clocked by the CLK signal along with the shift register 202. After two command words have been shifted into the shift register 202, the control circuit 205 generates a LOAD1 signal that is applied to a first storage register 206. The first storage register 206 then loads the first two command words from the shift register 202. After two more command words have been shifted into the shift register 202, the control circuit 205 generates a LOAD2 signal that is applied to a second storage register 208. The second storage register 208 then loads the remaining two command words from the shift register 202. The first and second storage registers 206, 208 then collectively output four 10-bit command words. The command decoder latches the N M-bit command words from the storage registers 206, 208 responsive to a LOAD DEC signal generated by the control circuit 205 on the clock edge after the storage register 208 has been loaded. The command decoder 216 then outputs decoded commands COMMAND on a command bus 220, and the comparator 214 generates a CHPSEL signal on line 222. As explained below, the CHPSEL signal, when active high, causes the memory device containing the command buffer 200 to perform a function corresponding to one or more of the COMMAND signals on the command bus 220.

In the embodiment shown in FIG. 4 in which two sets of two 10-bit command words are shifted into the shift register 202, the first and second storage registers 206, 208 receive and store 40 bits of command words. However, in the more general case, the shift register 202 has N/Y stages, each of which has a width of M bits, and Y storage registers 206, 208 each load N/Y M-bit command words. In an example where M is 8, and Y and N are both 4, the shift register 202 has a single stage having a width of 8 bits, and 4 storage registers each load 1 8-bit command word. Also, in the embodiment shown in FIG. 4, each of the command words is shifted through two stages of the shift register 202 each CLK cycle.

After the first storage registers 206 has been loaded, it continuously outputs the first two command words to an initialization decoder 210, an ID register 212, a comparator 214, and a command decoder 216. The function of the decoder 210, ID register 212, and comparator 214 is to examine the ID portion of the first command word and determine whether the command word is intended for the memory device containing the command buffer 200. More specifically, the command buffer 200 is programmed with a unique identifying code included in an initialization command packet during an initialization routine. A portion of an initialization command word output from the storage register 206 is applied to the decoder 210, and another portion is applied to the ID register 212. The portion of the initialization command packet is recognized by the decoder 210, which then generates a latch signal which causes the ID register .212 to store the other portion of the initialization command word. The portion of the initialization command word stored in the ID register 212 that uniquely identifies the memory device containing the command buffer 200. Thus, the portion of the command word decoded by the decoder 210 is the same for all memory devices, while the portion of the command word applied to the ID register 212 is different for each memory device. (During the initialization, means are provided to prevent all of the memory devices from simultaneously responding to the initialization command packet, as explained below.) Thus, after initialization, the ID register 212 contains identifying data that is unique to the memory device that contains the command buffer 200.

After the identifying data have been stored in the ID register 212, an ID portion of the command word from the storage register 206 is applied to the comparator 214. The comparator 214 then compares the ID portion of the command word to the identifying data stored in the ID register 212. In the event of a match, the comparator 214 generates an active CHPSEL signal that causes the memory device to carry out the operation corresponding to the COMMAND on the command bus 220. Significantly, the comparator 214 is able to compare the ID portion of the command word to the identifying data stored in the ID register 212 after only two of the command words have been shifted into the shift register 202. This is in contrast to the command buffer described in the Manning application in which the comparator 214 is not able to compare the ID portion of the command packet to identifying data stored in an ID register until one clock period later after all four command words have been shifted into the shift register. Furthermore, the command buffer 200 is able to start decoding the first three command bits after the first two command word have been shifted into the shift register 202. In contrast, the command buffer described in the Manning application is not able to start decoding any command bits until all four command word have been shifted into a shift register 202. By processing a portion of the command packet before the entire command packet has been received by the command buffer 200, the command buffer is able to more rapidly complete processing of the command packet.

Figure 5:
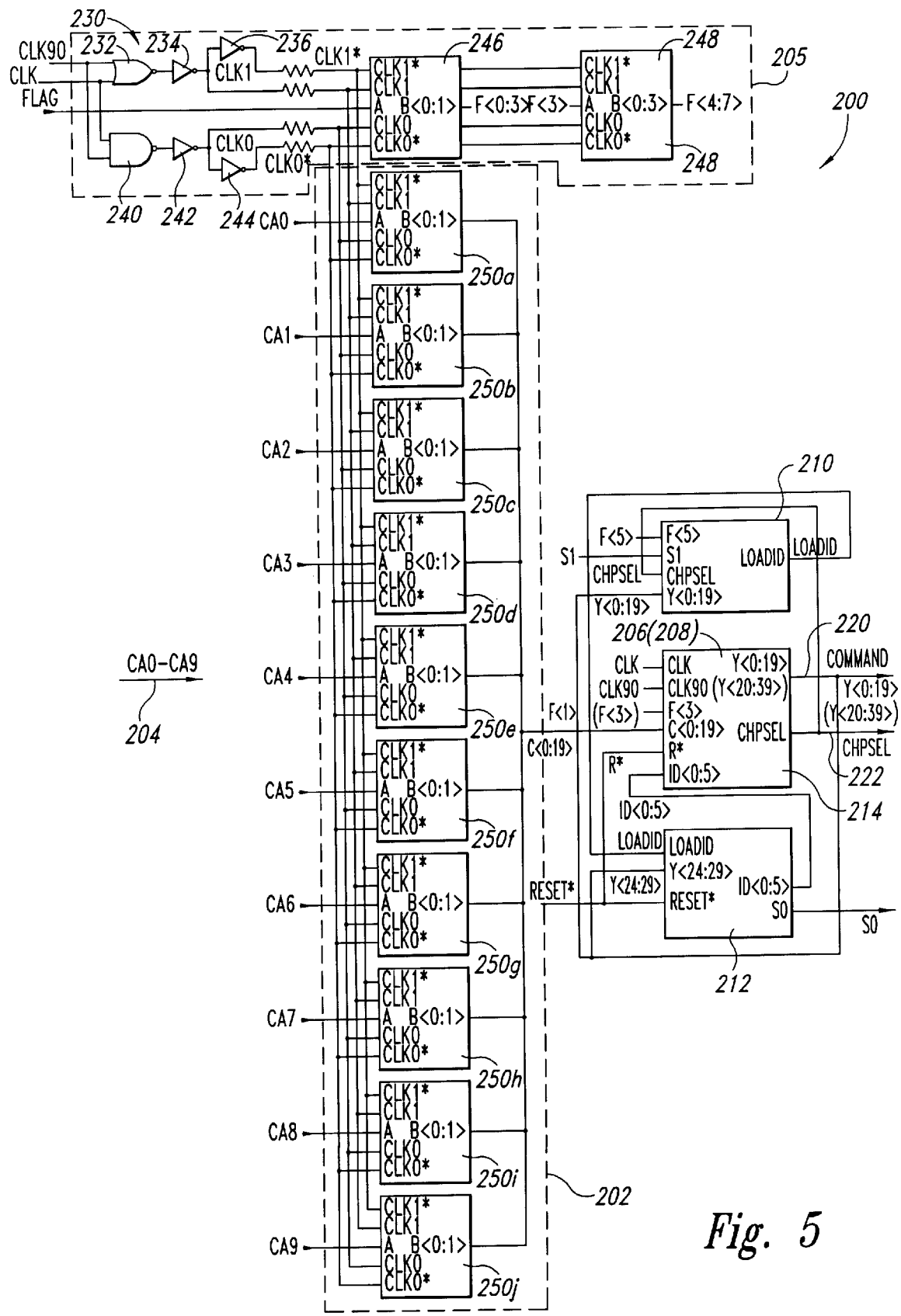
FIG. 5 is a more detailed block diagram of a command buffer that is usable in the packetized DRAM of FIG. 3.

The command buffer 200 is shown in greater detail in the block diagram of FIG. 5. As shown in FIG. 5, the control circuit 206 includes a clock circuit 230 that receives a clock signal CLK and its quadrature CLK90 from elsewhere in the memory device containing the command buffer 200. The CLK and CLK90 signals are applied to a NOR gate 232 which outputs a high whenever CLK and CLK90 are both low, as illustrated in the timing diagram of FIG. 6. The output of the NOR gate 232 is applied through a first inverter 234 to generate a CLK1 signal and then through a second inverter 236 to generate a CLK1* signal (the "*" symbol after a signal name is used throughout to designate the compliment of the signal).

Figure 6:
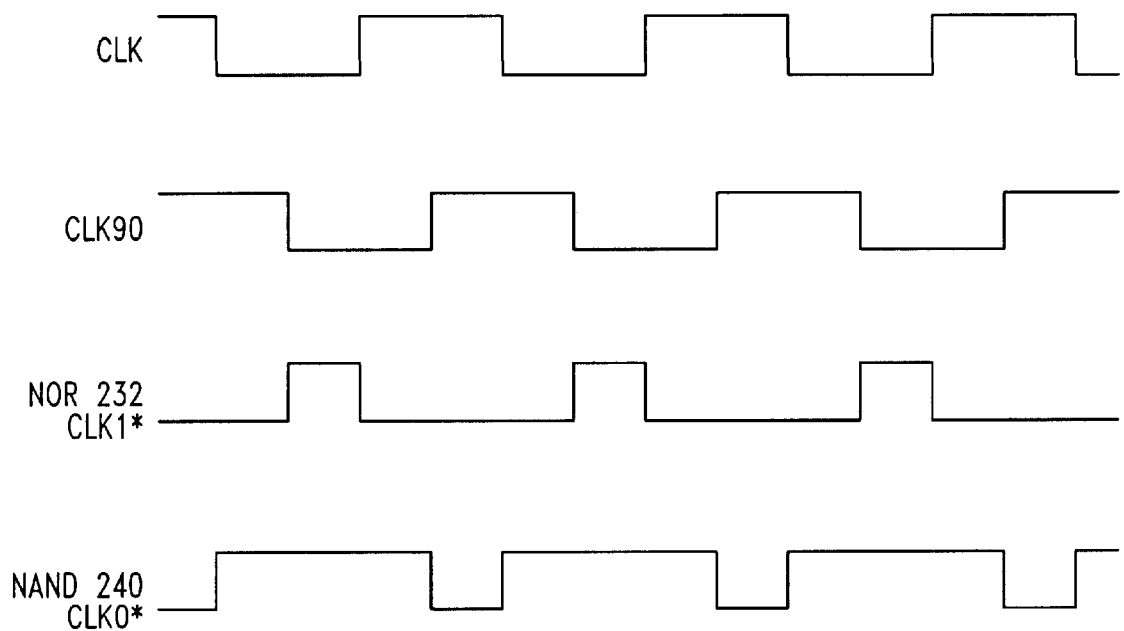
FIG. 6 is a timing diagram showing the clock signals used in a portion of the control circuit of the command buffer shown in FIGS. 4 and 5.

The CLK90 and CLK signals are also applied to a NAND gate 240 that outputs a low whenever both CLK and CLK90 are high, as also illustrated in FIG. 6. The output of the NAND gate 240 is coupled through an inverter 242 to generate a CLK0 signal and then through a second inverter 244 to generate a CLK0* signal. These signals are used throughout the command buffer 200, as explained in detail below.

The control circuit 206 also includes a pair of shift registers 246, 248 that are connected in series with each other to form an 8-stage shift register. The shift register 246 receives the FLAG signal and sequentially shifts it through the four stages of the shift register circuit 246 and then through the four stages of the shift register circuit 248 responsive to the CLK0, CLK0*, CLK1, and CLK1* signals. The FLAG signal is shifted through two stages of the shift register circuits 246, 248 each cycle of the CLK signals. Thus, when FLAG goes high, two successive F<0:7> outputs of the shift register circuits 246, 248 sequentially go high each clock cycle.

The shift register 202 shown in FIG. 5 includes ten separate shift register circuits 250a–j, each of which receive a respective bit CA0–CA9 of the incoming 10-bit packet word. As explained further below, each of the shift register circuits 250a–j includes two shift register stages. Thus, after each clock cycle, two command bits CA have been shifted into each shift register circuit 250, and these bits are available as a 2-bit word B<0:1>. Thus, the ten shift register circuits 250a–j collectively output a 20 bit of the command packet.

The remaining components of the command buffer 200 are the decoder 210, the ID Register 212, and the storage register 208 and comparator 214 which are shown as one block in FIG. 5. These components operate as explained above. However, the block diagram of FIG. 5 shows some additional signal inputs and outputs, namely, the SI and RESET* inputs and the SO output. All of these signal inputs and outputs are used during the initialization sequence. Specifically, at initialization, the RESET* input goes active low to load predetermined identification data, i.e., the number "63," into the ID register 212. As explained below, the RESET* signal also clears all 20 bits of each storage register 206, 208 so that a spurious COMMAND signal does not appear on the command bus 220. By setting the identification data in the ID register 212 to a known value, i.e., 63, the processor is able to subsequently load the ID register 212 with identifying data that is unique to the memory device containing the command buffer 200. As mentioned above, the comparator 214 must generate a CHPSEL signal to allow the memory device to perform various functions. Included in these various functions is decoding the portion of the command word that allows the decoder 210 to generate the. LOADID signal. Thus, if the processor was not able to apply to the command buffer 200 a command packet containing the identifying data in the ID register 212, the comparator 214 would not generate the CHPSEL output. Without the CHPSEL output, the decoder 210 would not generate the LOADID output to load the identifying data into the ID register 212. However, the command packet initially contains the binary equivalent of 63 which is favorably compared by the comparator 214 to the "63" initial identifying data in the ID register 212. Thus, on this initialization command, the comparator 214 generates the CHPSEL signal which allows the decoder 210 to generate a LOADID signal that latches other portions of the command words into the ID register 212 as the unique identifying data for the memory circuit containing the command buffer 200.

During the initialization routine, all of the memory devices in the computer system 10 (FIG. 1) receive the same command packet and thus would latch the same identifying data into their respective ID registers 212 if there were not some means to prevent all of the memory devices from simultaneously responding to the initialization command packet. The SI input and the SO output are provided for this purpose. Assuming that the computer system 10 contains three memory devices 16, the SI input of the first memory device is permanently held high through a jumper or similar means. A high SI input allows the command decoder 210 to generate a LOADID output to load a portion of the command packet into the ID register 212 as the unique identifying data. The SO output of the first memory device is coupled to the SI input of the second memory device, and the SO output of the second memory device is coupled to the SI input of the third memory device. The SO output of each of the memory devices is initially low. However, when unique identifying data is loaded into the ID register 212, the ID register 212 generates a high SO output. The high SO output coupled to the SI input of the subsequent memory device allows the subsequent memory device to be programmed with the identifying data. Thus, after the identifying data has been loaded into the ID register 212 for the first memory device, its SO output goes high thereby driving the SI input of the second memory device high. As a result, the identifying data in the initialization command packet is loaded into the ID register 212 of the second memory device which then generates a high SO output. The high SO output drives the SI input of the third memory device high which allows the ID register 212 of the third memory device to receive and store identifying data in the third initialization command packet. Once the unique identifying data has been stored in the ID register 212, the memory device no longer responds to the initialization command packet because the identifying data is no longer "63," which is the identifying data in the initialization command packet.

As explained above with reference to FIG. 5, the shift register 202 shown in FIG. 3 includes ten separate shift register circuits 250a–j, each of which receive a respective bit CA0–CA9 of the incoming 10-bit packet word. As illustrated in FIG. 6, each of the shift registers 250a–j includes two shift register stages 252a,b. The first stage 252a receives the packet word bit CA, and its output is connected to the input of the second stage 252b and to an external output B<0>. The output of the second stage 252b is connected to an external output B<1>. Transfer from the input to the output of each stage 252a,b is in response to four clock signals CLK0, CLK0*, CLK1, CLK1* as explained in greater detail below. After two clock cycles, two command word bits CA have been shifted into the shift register stages 252a,b and both of these bits are available as a 2-bit word B<0:1>. Thus, the ten shift register circuits 250a–j collectively output two 10-bit command words.

Figure 8:
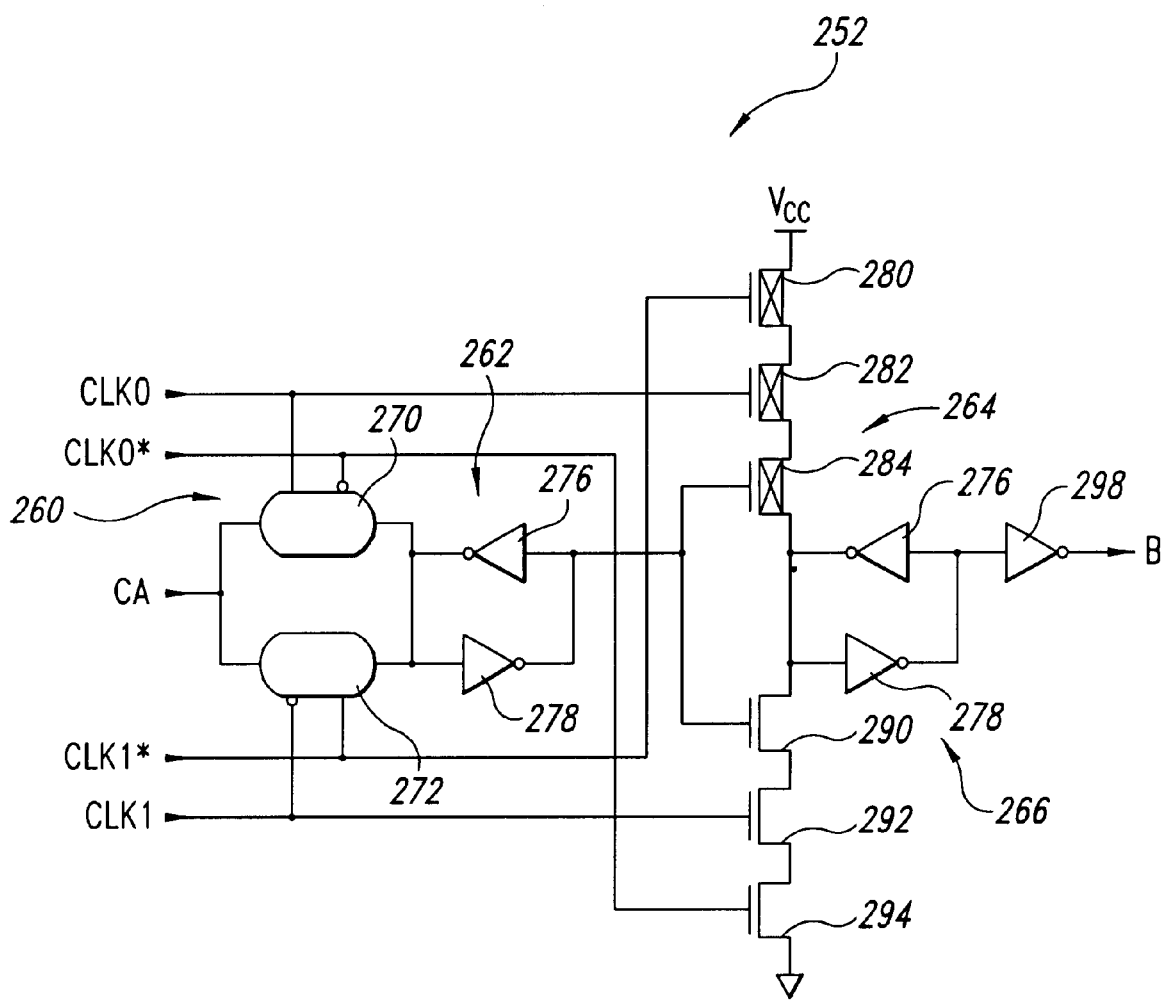
FIG. 8 is a schematic and logic diagram of a shift register stage used in the shift register circuit of FIG. 7.

Each of the shift register stages 252 is shown in greater detail in FIG. 8. Each of the shift register stages 252 includes a first transfer gate 260, a second transfer gate 264, and a second latch 266. The transfer gate 260 includes a first transfer gate circuit 270 operated by the CLK0 and CLK0* signals and a second transfer circuit 272 in parallel with the first transfer circuit 270 and operated by the CLK1 and CLK1* signals. The first latch 262 and the second latch 266 are each formed by a pair of inverters 276, 278 connected input-to-output. The second transfer gate 264 is formed by three PMOS transistors 280, 282, 284 connected between a supply voltage and the input to the second latch 266. The second transfer gate 264 also includes three NMOS transistors 290, 292, 294 connected in series between the input to the second latch 266 and ground. As explained below, the second transfer gate 264 inverts the signal from the first latch 262. Therefore, to restore the correct phasing of the command signals CA, an inverter 298 is provided at the output of the second latch 266.

Each of the transfer gate circuits 270, 272 are formed by an NMOS transistor and a PMOS transistor (not shown) connected in parallel with each other with the gate of the NMOS transistor being coupled to the non-inverting input and the gate of the PMOS transistor coupled to the inverting input.

Figure 9:
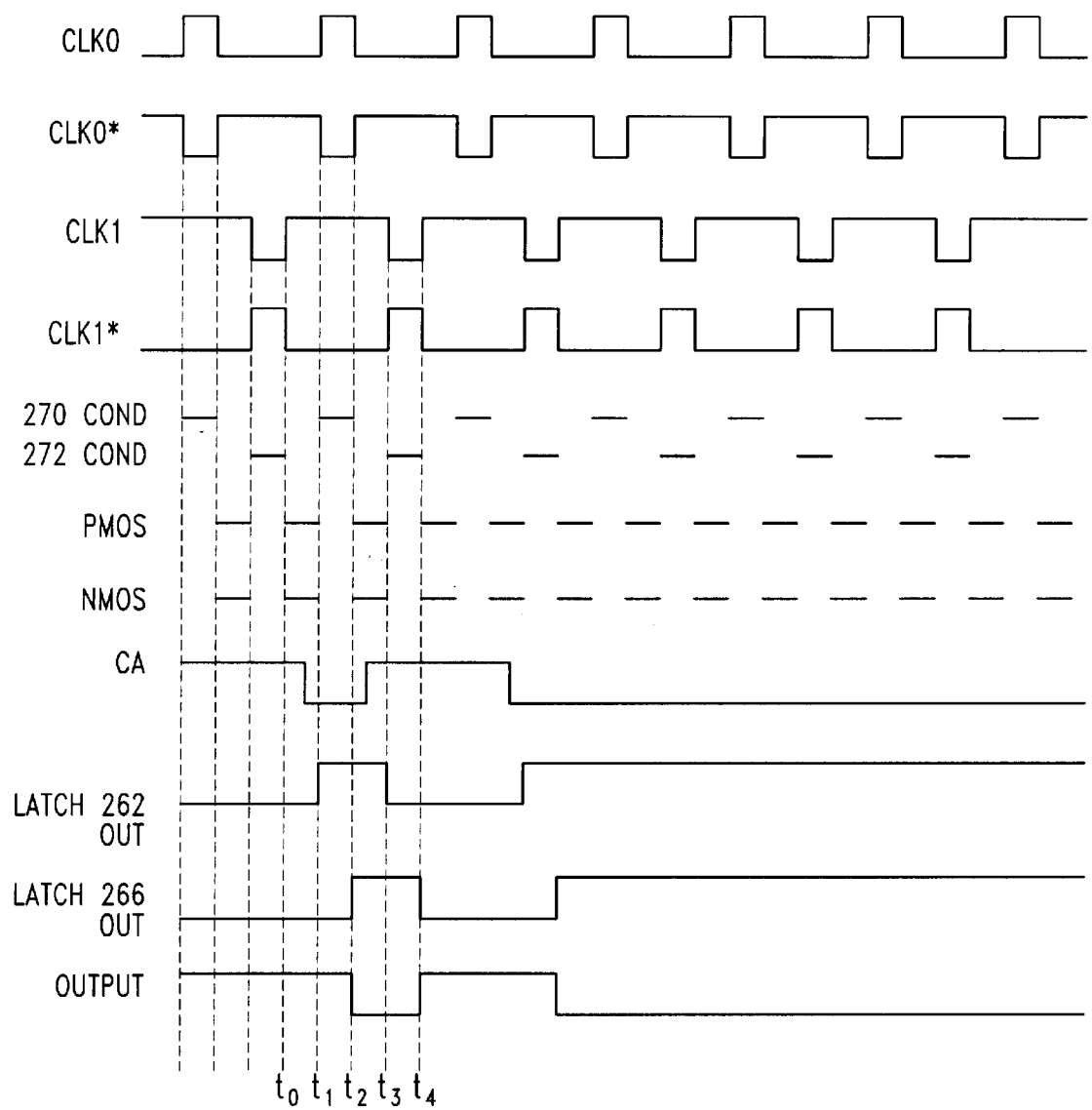
FIG. 9 is a timing diagram showing the various signals present in the shift register stage of FIG. 8.

The operation of the shift register stage 252 shown in FIG. 8 is best explained with reference to the timing diagram of FIG. 9. The transfer gate circuit 270 is conductive whenever the CLK0 signal is high and the CLK0* signal is low. Thus, the transfer gate circuit 270 is conductive for a short period each clock cycle, as shown by the line segments adjacent the 270 COND designation in FIG. 9. Similarly, the transfer gate 272 is conductive whenever the CLK1 signal is low and the CLK1* signal is high. As shown by the line segments in FIG. 8, the transfer gate circuit 272 is conductive for a short period each clock cycle, with the conductive period of the transfer gate circuit 270 being equally spaced from the conductive period of the transfer gate circuit 272. Thus, the first transfer gate 260 is conductive twice each clock cycle, with each conductive period followed by a period of non-conductivity. Each time the transfer gate 260 is conductive, the inverse of the command bit CA is output from the latch 262 to the second transfer gate 264.

The function of the second transfer gate 264 is to couple the input to the second latch 266 to either Vcc or ground at the proper time depending upon the value at the output of the first latch 262. The PMOS transistors 280, 282 are conductive whenever CLK0 and CLK1* are both low, which occurs at times designated by the line segments adjacent the "PMOS" designation in FIG. 9. The NMOS transistors 292, 294 are both conductive whenever the CLK1 signal and the CLK0* signal are both high, which occurs twice each clock cycle at the times designated by the line segments adjacent "NMOS" in FIG. 9. Thus, the PMOS transistors 280, 282 and the NMOS transistors 292, 294 are all conductive at the same times, and these periods of conductivity alternate with the periods of conductivity of the first transfer gate 260. The input to the second latch 260 is coupled to either $V_{CC}$ or ground during these periods of conductivity depending upon whether the output of the first latch 262 turns ON the PMOS transistor 284 or the NMOS transistor 290. More specifically, if the output of the first latch 262 is high, the NMOS transistor 290 will turn ON, thereby applying a low to the input of the second latch 266. If the output of the first latch 262 is low, the PMOS transistor 284 will turn ON, thereby applying a high to the input of the second latch 266. Thus, the second transfer gate 264 couples the inverted output of the first latch 262 to the input of the second latch 266.

During the time that the second transfer gate 264 is conductive, the second latch 266 outputs a signal that is the same as the output of the first latch 262 which, after passing through the inverter 298, is the same phase as the incoming command bit CA. The operation of the latch circuit 250 is shown using a command bit CA, which is initially high, but goes low shortly after to. During the next conductive period of the first transfer gate 260 at time tl, the high command bit CA is transferred to the output of the first latch 262 in inverted form as shown in FIG. 9. During the next conductive period of the second transfer gate 264, the high at the output of the latch 262 is coupled to the output of the latch 266, thereby causing the output to go low at time $t_2$. Shortly thereafter, the command bit CA goes high. At the next conductive period of the first latch 260 at time $t_3$, this high is coupled through the first latch 260, thereby causing the output of the second latch 262 to go low. On the next conductive period of the second transfer gate 264 at time $t_4$, the high output of the first latch 262 is coupled to the output of the second latch 266, thereby causing the output to go high. Thus, a command bit coupled to the shift register stage 252 is shifted to the output of the shift register stage 252 less than one clock cycle later. On the next half clock cycle, the command bit is shifted to the output of the next shift register stage until one clock cycle has elapsed, at which time two command bits have been shifted into each shift register circuit 250. Thus, two command bits are shifted through each shift register circuit 250 each clock cycle in the same manner that the FLAG signal is shifted through two stages of the shift register circuit 246, 248 (FIG. 5) each clock cycle.

Figure 7:
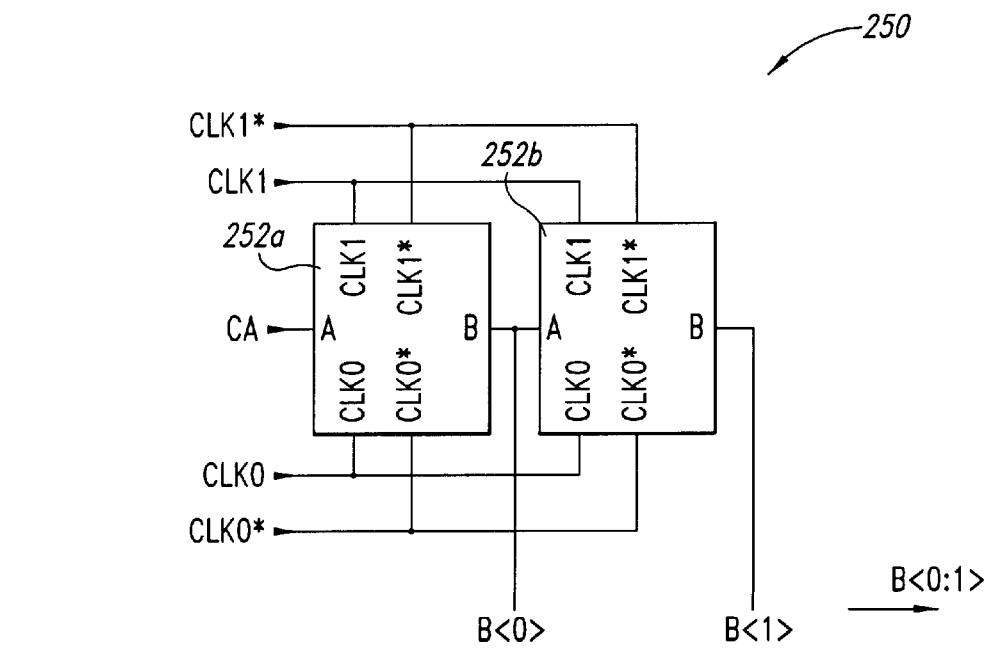
FIG. 7 is a logic diagram of one of the shift register circuits used in the command buffer shown in FIGS. 4 and 5.

The shift register circuits 250 shown in FIG. 7, including the shift register stages shown in FIG. 8, are also used as the shift registers 246, 248 in the control circuit 206 (FIG. 5).

Figure 10:
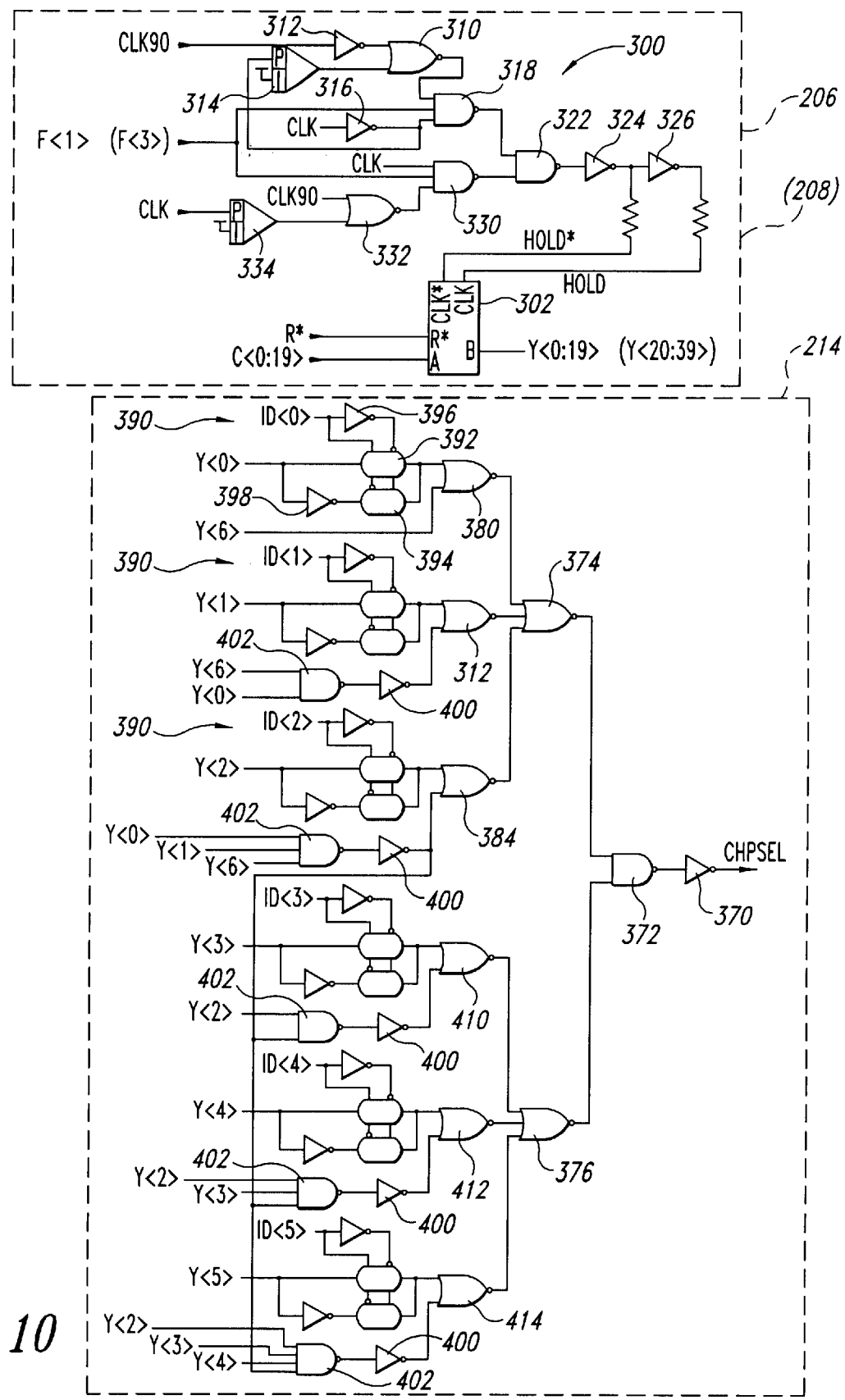
FIG. 10 is a schematic and logic diagram of a storage register and a comparator used in the command buffer shown in FIGS. 4 and 5.

The storage registers 206, 208 and the comparator 214 are illustrated in FIG. 10 in which the reference numerals and signal names for the storage register 208 are placed in parentheses. The storage registers 206, 208 each include a control circuit 300 for generating HOLD signals to load two 10-bit command words from the shift register 202 into a 20-bit register 302. The control circuit 300 includes a NOR gate 310 that receives a CLK90* signal generated by passing the CLK90 signal through an inverter 312. The NOR gate 310 also receives the output of a delay circuit 314 which, in turn, is driven by the output of an inverter 316 that receives the CLK signal. The output of the NOR gate 310 goes high whenever CLK90 is high and whenever CLK is high after the delay provided by the delay circuit 314. The output of the NOR gate 310 is applied to one input of a three input NAND gate 318. The NAND gate 318 also receives a CLK* signal from the inverter 316 and an F signal (F<1> in the case of the storage register 206 and F<3> in the case of the storage register 208) from the control circuit 206 (FIG. 5). The output of the NAND gate 318 is low when all of its inputs are high. Thus, the output of the NAND gate 318 is low when the CLK90 signal is high, the delayed CLK is high, the CLK signal is low, and the F signal (F<1> or F<3>) is high. As can be seen by examining these signals in the timing diagram of FIG. 6, this combination of signals exists whenever the F signal is high at a falling edge of the CLK signal.

The low at the output of the NAND gate 318 is applied to a NAND gate 322 which then outputs a high which is coupled through two inverters 324, 326. Thus, on the falling edge of CLK whenever the F signal goes high, the output of the inverter 324 generates an active low HOLD* and the inverter 326 generates an active high HOLD signal.

The active low HOLD* signal and the active high HOLD signal are also generated if the other input to the NAND gate 322 goes low. The other input to the NAND gate 322 is driven by the output of a NAND gate 330 which receives the CLK signal, the F signal (F<1> for register 206 and F<3> for register 208) and the output of a NOR gate 332. The NOR gate 332, in turn, receives the CLK90 signal and the CLK signal after being delayed by a delay circuit 334. Thus, the output of the NAND gate 330 goes low to generate an active HOLD and HOLD* signals when the CLK signal is high, the CLK90 signal is low, the delayed CLK signal goes low, and the F signal (F<1> for register 206 and F<3> for register 208) goes high. As can also be seen by examining these signals in the timing diagram of FIG. 6, this combination of signals exists whenever the F signal is high at a rising edge of the CLK signal.

In summary, active HOLD and HOLD* signals are generated and applied to the 20-bit register 302 for the storage register 206 on either the rising edge or the falling edge of the CLK signal after the F<1> signal is generated by the control circuit 205 (FIG. 5). The control circuit 205 generates the F<1> signal two clock edges after the FLAG signal is applied to the control circuit 205. As explained above, after two clock edges (i.e., one clock cycle), the first two 10-bit command words have been shifted into the shift register 202, and it is at this time that the HOLD and HOLD* signals transfer these 20 bits to the register 302.

Similarly, active HOLD and HOLD* signals are generated and applied to the 20-bit register 302 for the storage register 208 on either the rising edge or the falling edge of the CLK signal after the F<3> signal is generated by the control circuit 205. The control circuit 205 generates the F<3> signal four clock edges after the FLAG signal is applied to the control circuit 205. As explained above, after four clock edges (i.e., two clock cycles), the second two 10-bit command words have been shifted into the shift register 202. It is at this time that the HOLD and HOLD* signals transfer these 20 bits to the register 302 for the storage register 208.

The register 302 includes 20 register cells 340a–340t each of which receives an active low reset signal R*, the HOLD and HOLD* signals and one of the 20 bits C<0:19> from the shift register 202. One of the register cells 340b is shown in detail in FIG. 11 where the signals for the register 302 in the storage register 208 are one again shown in parentheses. The register cells 340 each include a first transfer gate 344, a first latch 346, a second transfer gate 348, and a second latch 350. The input to the second latch 350 is selectively pulled high by a PMOS transistor 352 whenever the reset signal R* goes low to cause its output Y to go low. Thus, upon reset, all of the outputs Y of the storage registers 206, 208 are set low.

The first transfer gate 344 includes an NMOS transistor (not shown) having its gate connected to the HOLD input and a PMOS transistor (not shown) connected in parallel with the NMOS transistor having its gate connected to the HOLD* input. Thus, the transfer gate 344 is closed when the HOLD and HOLD* signals are active. The second transfer gate 348 also uses an NMOS transistor (not shown) in parallel with a PMOS transistor (not shown), but their gates are connected to the HOLD and HOLD* signals with the opposite polarity. Thus, when HOLD and HOLD* are active, a command bit from the shift register 202 is transferred to the latch 346. Shortly thereafter when the HOLD and HOLD* signals become inactive, the transfer gate 348 closes to transfer the command bit to the second latch 350. As with the latches used in the shift register stages 252 (FIG. 8), each of the latches 346, 350 is formed by a pair of inverters 360, 362 connected input-to-output.

Returning to FIG. 10, the comparator 214 includes a collection of logic circuits that compare 6 bits of identifying data ID<0:5> with six command bits from the storage register 208 to generate an active high chip select CHPSEL signal when a command is intended for use by the memory device containing the command buffer 200. The operation of the comparator 214 can best be understood by tracing backward from an active high chip select CHPSEL output. The CHPSEL output is generated at the output of an inverter 370 that is coupled to the output of a NAND gate 372. The CHPSEL will be active high whenever the output of the NAND gate 372 is low, which will occur whenever both inputs to the NAND gate 372 are high. The inputs to the NAND gate 372 are generated at the outputs of NOR gates 374, 376. The outputs of the NOR gates 374, 376 will both be high if all of the inputs to the NOR gates 374, 376 are low. The inputs to the NOR gate 374 will all be low if the output of any of three NOR gates 380, 382, 384 is high. Each NOR gate 380, 382, 384 has two inputs, one of which is connected to the output of an exclusive OR circuit 390 and the other of which is coupled to one of the command bits Y, either directly or through additional logic circuitry.

Each of the exclusive OR circuits 390 includes a pair of transfer gates 392, 394 which are alternately enabled by an ID bit and its compliment ID* at the output of an inverter 396. The transfer gate 392 receives the command bit Y while the transfer gate 394 receives the complement of the command bit Y* from an inverter 398. If the command bit Y and the ID bit are both low, then the transfer gate 394 is enabled, and the high complement of the command bit is coupled through the transfer gate 294 to the input of the NOR gate 380. If the command bit Y and the ID bit are both high, then the transfer gate 392 is enabled, and the high command bit is coupled to the input to the NOR gate 380. Thus, the output of the exclusive OR circuit 390 is high if the command bit Y matches the identifing bit ID.

If the command bit Y is low and the identifing bit ID is high, then the transfer gate 392 is enabled and the low command bit is transferred to the input of the NOR gate 380. Finally, if the command bit is high but the identifying bit ID is low, then the transfer gate 394 is enabled and the low complement of the command bit Y is coupled through the transfer gate 394 to the NOR gate 380. Thus, the output of the exclusive OR circuit 390 is low in the event the command bit Y does not match the identifying bit ID.

The output of the NOR gate 380 will thus be low if either the Y<0> command bit matches the ID<0> identifying bit or the Y<6> command bit is high Similarly, the output of the NOR gate 382 will be low if either the Y<1> command bit matches the ID<1> bit or the output of an inverter 400 is high which results when the output of a NAND gate 402 is low which occurs when the Y<6> and Y<0> commands bits are both high. Similarly, the output of the NOR gate 384 is low whenever either the Y<2> command bit matches the ID<2> bit or the Y<0>, Y<1>, and Y<6> commands bits are all high after being coupled through the NAND gate 402 and inverter 400.

The inputs to the NOR gate 376 will all be low if either input to each of three NOR gates 410, 412, 414 is high. Thus, the inputs to the NOR gate 376 will all be low if the Y<3> command bit matches the ID3 bit, the Y<4> command bit matches the ID<4> bit, and the Y<5> command bit matches the ID<5> bit. All three inputs to the NOR gate 376 will also be low if the Y<0>, Y<1>, Y<6>, Y<2>, Y<3> and Y<4> commands bits are all high. Therefore, the CHPSEL signal will be generated if either the Y<0:5> command bits match the ID<0:5> identifying bits or if the Y<0:6> command bits are all high. The Y<0:6> command bits will all be high whenever the Y<6> command bit is high and the Y<0:5> command bits correspond to number 63. As mentioned above, at power-up, the identifying data ID<0:5> are set to "63" (binary "111111"). Thus, when unique identification data is to be recorded in the ID register 212 (FIGS. 3 and 4), the processor generates a command packet in which the Y<0:6> bits are all high. As a result, the comparator circuit 214 generates a CHPSEL signal which allows the decoder 210 to output a LOADID signal. After the unique Y<0:5> bits have been stored in the ID register 212, they are thereafter compared with the Y<0:5> command bits and, in the event of a match, the CHPSEL signal is generated to allow memory device containing the command buffer 200 to perform a function corresponding to other bits of the command word.

Figure 11:
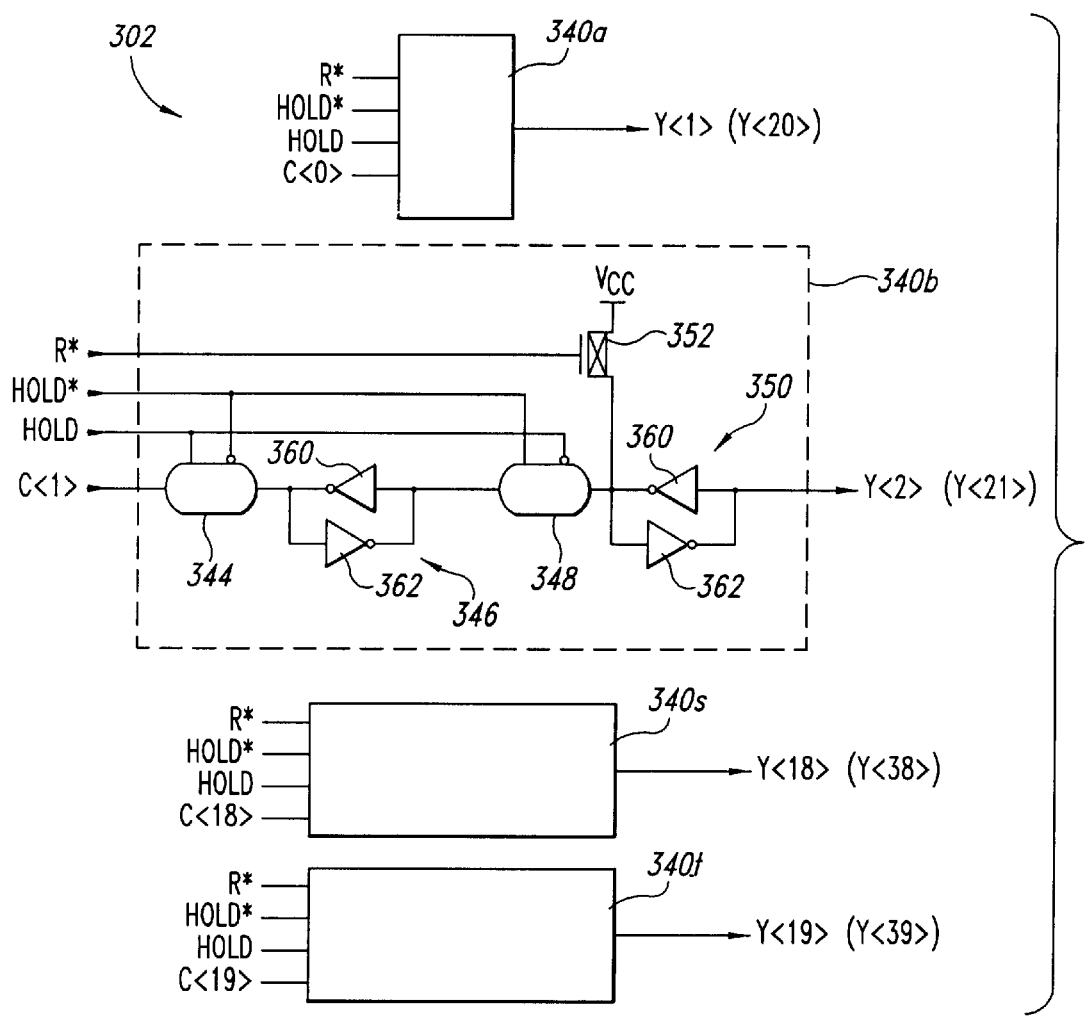
FIG. 11 is a logic diagram of a register circuit used in the storage register shown in FIG. 10.

The decoder 210 (FIGS. 4 and 5) is illustrated in further detail in FIG. 11. Again, the operation of the decoder 210 can best be understood by tracing the circuit back from an active high LOADID output. The LOADID output will be high whenever the input of an inverter 420 is low. The input of the inverter 420 is coupled to the output of a NAND gate 422 that will generate a low whenever all of its inputs are high. All of the inputs to the NAND gate 422 will be high when the chip CHPSEL and F<5> inputs are high and the Y<7:19> command bits have a predetermined pattern. More specifically, the F<5> input from the control circuit 205 is coupled through a pair of inverters 424, 426 to one input of the NAND gate 422. Another input to the NAND gate 422 is generated by an inverter 430 that receives the output of a NAND gate 432. The output of the NAND gate 432 will be low to cause the inverter 430 to apply a high to the input of the NAND gate 422 when all of the inputs to the NAND gate 432 are high. The inputs to the inverter 432 will all be high when the SI input is high and all of the inputs to two NOR gates 436, 438 are all low. Thus, the second input to the NAND gate 422 will be high whenever the SI signal is high and Y<13:19> are all low. The third input to the NAND gate 422 will be high whenever a low is applied to an inverter 440 by a NAND gate 442. The output of the NAND gate 442 will be low whenever all of its inputs are high. The first input to the NAND gate 442 is output by a NOR gate 444 which receives the complement of the Y<12> command bit from an inverter 446 and the Y<10> and Y<11> command bits. Thus, the output of the NOR gate 444 will be high when Y<10> and Y<11> are low and Y<12> is high. The second input to the NAND gate 442 is the CHPSEL signal which, as explained above, is high whenever a command packet is intended for execution by the memory device containing the command buffer 200. The third input to the NAND gate 442 will be high whenever all three inputs to a NOR gate 450 are low. The NOR gate 450 receives the Y<7> and Y<8> command bits and the complement of the Y<9> command bit through an inverter 452. Thus, the output of the NAND gate 442 will be low whenever CHPSEL, Y<12> and Y<9> are high and Y<7>, Y<8>, Y<9>, Y<10>and Y<11> are low.

In summary, a LOADID pulse will be generated to load identifying data into the ID register 212 (FIGS. 4 and 5) on the F<5> pulse from the control circuit 205 (FIGS. 4 and 5) whenever the SI signal is high and Y<19:7> are decoded as "0000000100100" As explained above, the SI input is coupled to the SO output of another memory device so that the command buffer of only one memory device at a time will generate a LOADID pulse responsive to an initialization command packet.

Figure 12:
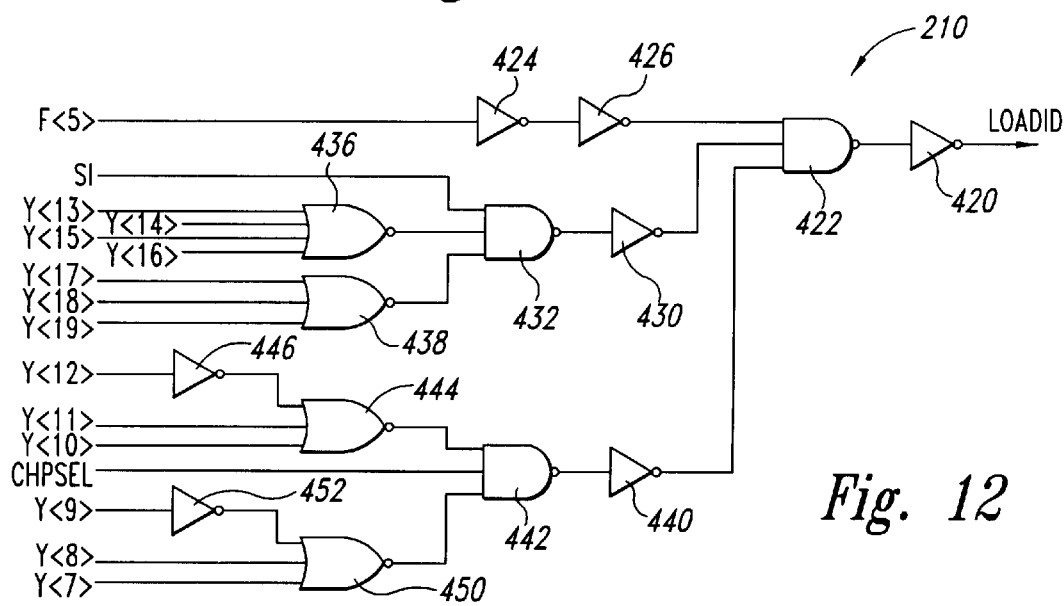
FIG. 12 is a logic diagram of a decoder used in the command buffer shown in FIGS. 4 and 5.
Figure 13:
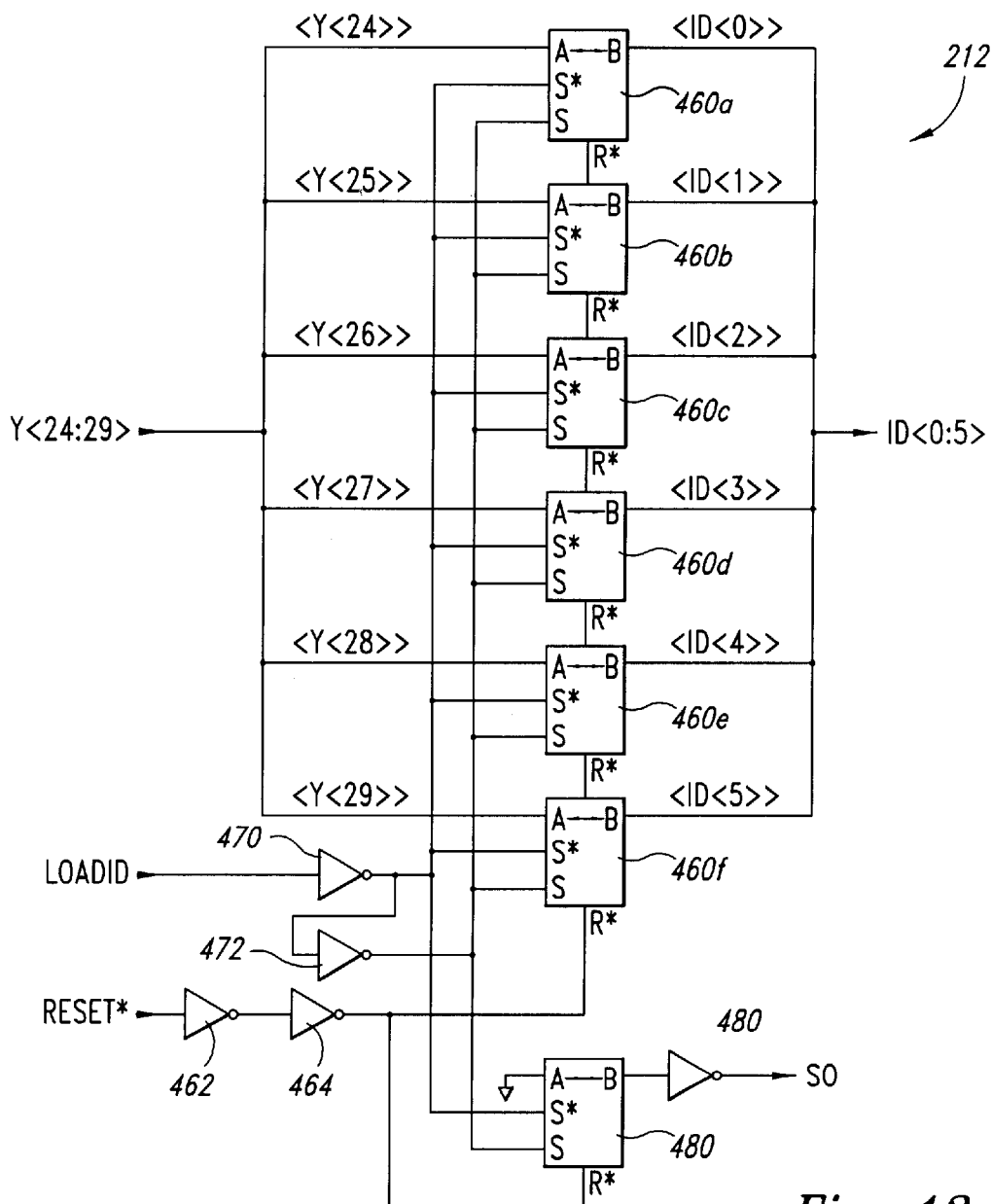
FIG. 13 is a logic diagram of an ID Register used in the command buffer shown in FIGS. 4 and 5 to store identifying data unique to each memory device.

The ID register 212 is shown in greater detail in FIG. 13. The ID register 212 includes six latch circuits 460a–460f, each of which receives a respective command bit Y<24:Y29> from the storage register 208 (FIGS. 4 and 5). The latch circuits 468a–468f each include a RESET* input that is coupled to an active low reset signal RESET* through inverters 462, 464. As explained above, prior to receiving the initialization command packet, the memory device is reset. The active low RESET* signal causes all of the latch circuits 460a–f to output a high which causes all of the bits of the identifying data ID<0:5> to correspond to, binary number "63" which allows the comparator circuit 214 to output a CHPSEL signal upon initialization as explained above with reference to FIG. 12. Thereafter, identifying data unique to each memory device are applied to the latch circuits 460a–f through the Y<24:29> command bits, and the LOADID pulse is then generated as explained above. The LOADID pulse is coupled through an inverter 470 to the S* inputs of the latch circuits 460a–f while the output of the inverter 470 is coupled through an inverter 472 to the S inputs of the latch circuits 460a–f. The active high S and active low S* signals cause the latch circuits 460a–f to store the Y<24:29> command bits as the unique identifying data ID<0:5> for the memory device containing the command buffer.

The ID register 212 also contains a latch circuit 480 and an inverter 482 for generating the SO output When the RESET* signal is driven active low, the latch 480 is reset to cause the inverter 482 to output a low SO signal. However, the LOADID pulse latches a low to the output of the latch circuit 480, thereby causing the inverter 482 to drive SO high. The high SO signal is applied to the SI input of the decoder 210 in another memory device as explained above so that the other memory device will respond to the next initialization command packet.

Figure 14:
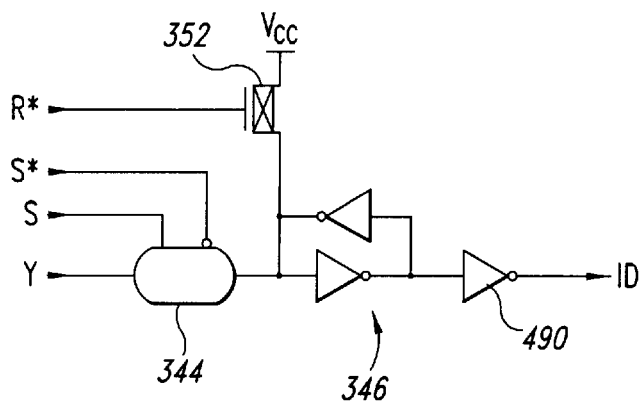
FIG. 14 is a schematic diagram of a latch circuit used in the ID Register Circuit of FIG. 13.

The latch circuit 460a–f used in the ID register 212 of FIG. 13 is shown in greater detail in FIG. 14. The latch circuit 460 is identical to the latch circuit 340 shown in FIG. 11 except that it includes only a single latch 346, it pulls the input to the first latch 346 high using the PMOS transistor 352, and it uses an inverter 490 in place of a second transfer gate 348 and latch 350 in the latch circuit 340 of FIG. 10. In operation, the active low RESET* signal turns ON the transistor 352 to drive the output of the inverter 490 high. In response to the active high S and active low S* signals, the transfer gate 344 closes to couple the command bit Y to the output ID after being inverted twice, once by the latch 346 and once by the inverter 490.

As mentioned above, the command buffer 200 shown in FIGS. 4–14 may be used in place of the command buffer 46 that is shown in FIG. 3. The resulting memory device may be used in the computer system shown in FIG. 1 to provide superior operating speed. While the invention has been described herein by way of exemplary embodiments, various modifications may be made without departing from the spirit and scope of the invention. Accordingly, the invention is not limited except as by the appended claims.

What is claimed is:

1. A method of processing a command packet of N M-bit command words for use by a memory device, N and M each being a positive, plural integer, the method comprising:
   sequentially storing command words until N/Y command words have been stored, where Y is a positive, plural integer;
   each time N/Y command words have been stored, transferring the *M$^1$ bits of the command words to one of Y respective storage locations; and
   outputting the command words from each of the Y storage locations.

2. The method of claim 1 wherein the step of outputting the command words from each of the Y storage locations comprises outputting the command words from at least one of the storage locations before command words have been transferred to another of the storage locations.

3. The method of claim 2 further comprising processing at least part of the command words transferred to the one storage location before command words have been transferred to the other storage location.

4. The method of claim 1 wherein N is equal to 4 and Y is equal to 2 so that 2 commands words are stored before being transferred to one of 2 storage locations.

5. The method of claim 1, further comprising the steps of:
   providing an identification word; and
   comparing at least a portion of a command word with the identification word, and, in the event of a match, performing an operation in the memory device that corresponds to another portion of a command word.

6. The method of claim 5, wherein the step of comparing the portion of a command word with the identification word comprises comparing a portion of a command word that is transferred to one of the storage locations before the command word to which the operation corresponds is transferred to another of the storage locations.

7. The method of claim 5 wherein the step of providing the identification word comprises:
   determining if at least a portion of the command word has a second predetermined value; and
   if at least a portion of the command word has a second predetermined value, storing at least a portion of a command word as the identification word.

8. The method of claim 1 wherein the memory device using the command words comprises a random access memory.

9. The method of claim 8 wherein the memory device using the command words comprises a dynamic random access memory.

10. The method of claim 9 wherein the memory device using the command words comprises a packetized dynamic random access memory.

11. In a computer system having a processor having a processor bus coupled to an input device, and output device, and a plurality of packetized memory devices, a method of processing a command packet of N M-bit command words in each of the memory devices for use by a memory device, N and M each being a positive, plural integer, the method comprising:
   sequentially storing command words in a plurality of the memory devices until N/Y command words have been stored, where Y is a positive, plural integer;

each time N/Y command words have been stored, transferring the *M² bits of the command words to one of Y respective storage locations;

outputting the command words from each of the Y storage locations.

providing respective identification words unique to each of the memory devices;

comparing at least a portion of a command word output from one of the storage locations in a plurality of the memory devices with the respective identification words for the memory devices; and in the event of a match between the portion of a command word and an identification word in a memory device, performing an operation corresponding to a command word in the memory device having an identification word matching the portion of the command word.

12. The method of claim 11 wherein the step of providing each of the identification words comprises:

determining if at least a portion of the command word has a second predetermined value; and if at least a portion of the command word has a second predetermined value, storing at least a portion of the command word as the identification word.

13. The method of claim 11 wherein the step of comparing the portion of a command word with the respective identification word comprises comparing a portion of a command words from at least one of the storage locations before command words have been transferred to another of the storage locations.

14. The method of claim 11 wherein N is equal to 4 and Y is equal to 2 so that 2 commands words are stored before being transferred to one of 2 storage locations.

15. The method device of claim 11, wherein N is equal to 8 and Y is equal to 2 so that four command words are stored before being transferred to on of the 2 storage locations.

16. A method of processing a multi-command word command packet applied to a memory device, comprising:

sequentially storing command words in the memory device as the command words are applied to the memory device; and processing at least a portion of at least one of the command words of a command packet that is stored in the memory device prior to storing other command words of the command packet that are subsequently applied to the memory device, the act processing of at least a portion of at least one of the command words comprising comparing the portion of the command word to a comparison word, and, in the event of a match, enabling the memory device to respond to other command words in the command packet.

* * * * *

UNITED STATES PATENT AND TRADEMARK OFFICE
CERTIFICATE OF CORRECTION

PATENT NO. : 6,519,675 B1  
DATED : February 11, 2003  
INVENTOR(S) : Troy A. Manning It is certified that error appears in the above-identified patent and that said Letters Patent is hereby corrected as shown below:

Title page,  
Item [56], References Cited, FOREIGN PATENT DOCUMENTS,  
"GB 0 605 887 A2  7/1995" should read -- GB 0 605 887 A2  7/1994 --  
Item [57], ABSTRACT,  
Line 2, "shift register for shifting for sequentially" should read -- shift register for sequentially --

Column 2,  
Line 36, "Peripheral component" should read -- peripheral component --  
Line 37, "operator or an electronic" should read -- operator of an electronic --  
Line 43, "printers and a video" should read -- printers and video --  
Line 49, "drives floppy disk drives" should read -- drives, floppy disk drives --

Column 3,  
Lines 51 and 57, "memory device 16 *a*" should read -- memory device 16*a* --  
Line 53, "memory device 16 *a*," should read -- memory device 16*a*, --

Column 4,  
Line 10, "receives a row is address" should read -- receives a row address --

Column 5,  
Line 47, "storage cells,, with" should read -- storage cells, with --  
Line 48, "having input terminal" should read -- having an input terminal --  
Line 54, "words having been shifted" should read -- words have been shifted --

Column 7,  
Line 17, "each load N/Y M-bit" should read -- each of which load N/Y M-bit --  
Line 19, "each load 1 8-bit" should read -- each of which load 1 8-bit --  
Line 23, "storage registers 206 has" should read -- storage register 206 has --  
Line 39, "register .212 to store" should read -- register 212 to store --  
Line 41, "register 212 that uniquely" should read -- register 212 uniquely --

Column 8,  
Line 4, "first two command word" should read -- first two command words --  
Line 8, "all four command word" should read -- all four command words --  
Line 25, "compliment of the signal)." should read -- complement of the signal). --

Column 9,  
Line 11, "to generate the." should read -- to generate the --

UNITED STATES PATENT AND TRADEMARK OFFICE
CERTIFICATE OF CORRECTION

PATENT NO.    : 6,519,675 B1
DATED         : February 11, 2003
INVENTOR(S)   : Troy A. Manning It is certified that error appears in the above-identified patent and that said Letters Patent is hereby corrected as shown below:

Column 11,
Line 22, "shortly after to. During" should read -- shortly after $t_0$. During --
Line 23, "at time t1, the high" should read -- at time $t_1$, the high --.

Column 12,
Line 59, "are one again shown" should read -- are once again shown --

Column 13,
Line 40, "and its compliment ID*" should read -- and its complement ID* --
Line 67, "commands bits" should read -- command bits --

Column 14,
Line 3, "commands bits are" should read -- command bits are --
Line 29, "allow memory device" should read -- allow the memory device --

Column 15,
Line 24, "to correspond to, binary" should read -- to correspond to binary --
Line 41, "SO output When the" should read -- SO output. When the --

Column 16,
Line 28, "2 commands words" should read -- 2 command words --
Lines 58-59, "system having a processor having a processor bus coupled" should read -- system having a processor bus coupled --

Column 18,
Line 1, "words from at least" should read -- word from at least --
Line 9, "transferred to on of the" should read -- transferred to one of the --

Signed and Sealed this

Twenty-seventh Day of April, 2004

JON W. DUDAS
*Acting Director of the United States Patent and Trademark Office*